(12) United States Patent
Mallikarjunaswamy (10) Patent No.: US 9,355,971 B1
(45) Date of Patent: May 31, 2016

(54) EOS PROTECTION FOR INTEGRATED CIRCUITS

(71) Applicant: Alpha and Omega Semiconductor Incorporated, Sunnyvale, CA (US)

(72) Inventor: Shekar Mallikarjunaswamy, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/747,787

(22) Filed: Jun. 23, 2015

(51) Int. Cl.
| H01L 29/00 | (2006.01) |
| H01L 23/62 | (2006.01) |
| H01L 23/525 | (2006.01) |
| H01L 23/522 | (2006.01) |
| H01L 23/532 | (2006.01) |
| H01L 29/73 | (2006.01) |
| H01L 29/744 | (2006.01) |
| H01L 49/02 | (2006.01) |

(52) U.S. Cl.
CPC ............ *H01L 23/62* (2013.01); *H01L 23/5226* (2013.01); *H01L 23/5256* (2013.01); *H01L 23/53257* (2013.01); *H01L 28/20* (2013.01); *H01L 29/7304* (2013.01); *H01L 29/744* (2013.01)

(58) Field of Classification Search
CPC . H01L 23/62; H01L 23/5226; H01L 23/5256; H01L 29/7304; H01L 29/744
USPC .......................................................... 257/529
See application file for complete search history.

(56) References Cited

U.S. PATENT DOCUMENTS

| 5,869,873 | A | * | 2/1999 | Yu ........................... H02H 9/046 257/355 |
| 5,925,922 | A | | 7/1999 | Rountree et al. |
| 6,455,898 | B1 | * | 9/2002 | Liu ...................... H01L 27/0266 257/355 |
| 7,473,973 | B2 | * | 1/2009 | Kondo ................ H01L 27/0262 257/355 |
| 7,772,650 | B2 | * | 8/2010 | Chiang ............... H01L 27/0251 257/355 |
| 2009/0303644 | A1 | * | 12/2009 | Barbier ............... H01L 27/0251 361/56 |

\* cited by examiner

*Primary Examiner* — Luan C Thai
(74) *Attorney, Agent, or Firm* — Van Pelt, Yi & James LLP

(57) ABSTRACT

In some embodiment, a fuse structure in a semiconductor device uses a metal fuse element connected to a stacked via fuse link connected to a thin film resistive element. The fuse structure can be incorporated in an integrated circuit for EOS protection. In other embodiments, an integrated EOS/ESD protection circuit includes a current limiting resistor integrated with an ESD protection circuit. In some embodiments, the current limiting resistor is formed in an N-well forming the collector of the ESD protection circuit.

18 Claims, 7 Drawing Sheets

EOS PROTECTION FOR INTEGRATED CIRCUITS

BACKGROUND OF THE INVENTION

Semiconductor devices, or semiconductor integrated circuits, are designed with protection circuits to protect against undesired over-voltage or over-current conditions that often occur at the input/output pins or the power supply pins of an integrated circuit, causing permanent damage to the integrated circuit. Over-voltage or over-current conditions experienced by semiconductor devices can include electrical overstress (EOS) events or electrostatic discharge (ESD) events.

Electrical overstress describes an event whereby a semiconductor device is operated above its absolute maximum electrical rating as specified in its data sheet. When a semiconductor device is subjected to a current or voltage that is beyond the specified limits of the device, thermally induced damage results which can lead to permanent device failure. An EOS event occurs when the semiconductor device is operating and typically has a long time span, such as from a few microseconds to a few seconds. In general, EOS events are associated with moderately high voltage (e.g. less than 100V) and large peak current (e.g. greater than 10 A) that occur over a long time frame (e.g. greater than 1 ms).

Electrostatic discharge (ESD) is a related voltage overstress condition which can occur to a semiconductor device at rest or while operating. The discharge of static electricity from another body at the input/output pins or the power supply pins of a semiconductor device can lead to permanent device failure. ESD events typically have a very short duration, such as less than 1 microsecond, and typically have a duration in a nanoseconds range. In general, ESD events are associated with very high voltage (e.g. greater than 500V) and moderate peak current (e.g. 1A to 10A) that occur in a very short time frame (e.g. less than 1 μs).

Accordingly, integrated circuits are designed with protection circuits for preventing EOS and ESD events at the input/output/supply pins from reaching internal circuitry and causing permanent damages.

In particular, integrated circuit pins need protection from EOS events caused by pin to pin shorts as a result of human/machine handling or when the integrated circuit is being soldered on circuit board. Pin-to-pin shorts on an integrated circuit can occur due to solder creepage during manufacturing and subsequent temperature cycling. For instance, EOS protection is needed in a DC-DC converter integrated circuit where the high voltage power supply pin can get shorted to an adjacent low voltage pin, resulting in an EOS event that damages the input-output circuit of the DC-DC converter, including the ESD protection circuit that may be provided at the I/O pins. Because ESD events are of short duration, ESD protection circuits are often not designed to handle the extended high current excursion of an EOS event. The large current and extended time period of an EOS event often result in excessive heating of the integrated circuit, causing the molding compound of the integrated circuit to catch fire or smoke. In the case of power supply pin shorts in a DC-DC converter, the EOS event damages the low voltage I/O pin and not the high voltage supply pin as the high voltage supply pin is designed with high voltage protection circuit.

Conventional techniques to protect against EOS events include using a fuse in series with the pins to be protected. The fuse opens up during an EOS event, thereby stopping the EOS event and preventing fire or smoke from occurring. However, fuses cannot be used in series with input-output pins that carry high currents as the normally high current level at an input-output pin may cause the fuse to open, even in the absence of an EOS event. Furthermore, the fuse should be capable of sustaining an ESD pulse and not be become open by an ESD pulse so as to allow the ESD protection circuit to operate to protect the circuit. For high current input-output pins, a current limiting resistor is used in place of a fuse. Other conventional techniques for EOS protection include using high voltage protection circuit to low voltage power supply pins. However, high voltage protection circuits are larger in size and thus increase the size of the integrated circuit when high voltage protection circuits are used for the low voltage power supply pins.

Figure 1A:
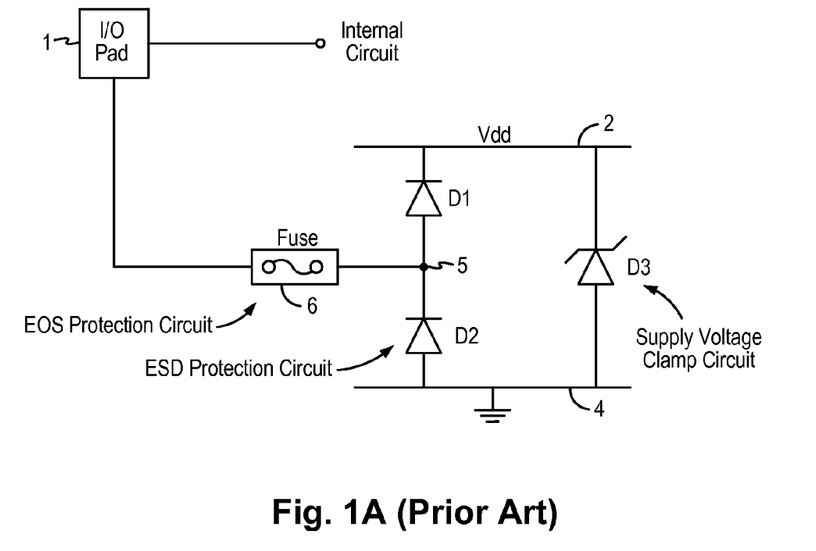
FIG. 1A illustrates EOS/ESD protection circuits for an input-output (I/O) pin of a semiconductor integrated circuit in some examples.

FIG. 1A illustrates EOS/ESD protection circuits for an input-output (I/O) pin of a semiconductor integrated circuit in some examples. An I/O pin of an integrated circuit is connected to an I/O pad 1 on the semiconductor substrate of the integrated circuit. The I/O pad 1 may be connected to an EOS protection circuit in the form of a fuse 6 connected in series with the I/O pad. An ESD protection circuit formed by pn junction diodes D1 and D2 is provided on the other end of fuse 6. In particular, the fuse 6 is connected to the common node 5 of diodes D1 and D2 which are connected in series between the positive power supply voltage Vdd (node 2) and ground (node 4). The pn junction diodes D1 and D2 operate to shunt ESD spikes detected at the common node 5 to either the supply voltage Vdd or ground. In some cases, a supply voltage clamp circuit is also provided to protect the power supply voltage pin. In the present example, a zener diode D3 is coupled between the supply voltage Vdd and ground in reverse bias configuration to prevent the power supply voltage Vdd from exceeding a given voltage value. As thus configured, the fuse 6 provides protection against EOS event. However, an EOS protection circuit using a fuse cannot be used for high current I/O pins as the normally high operating current of the I/O pin may open fuse 6 in the absence of an EOS event.

Figure 1B:
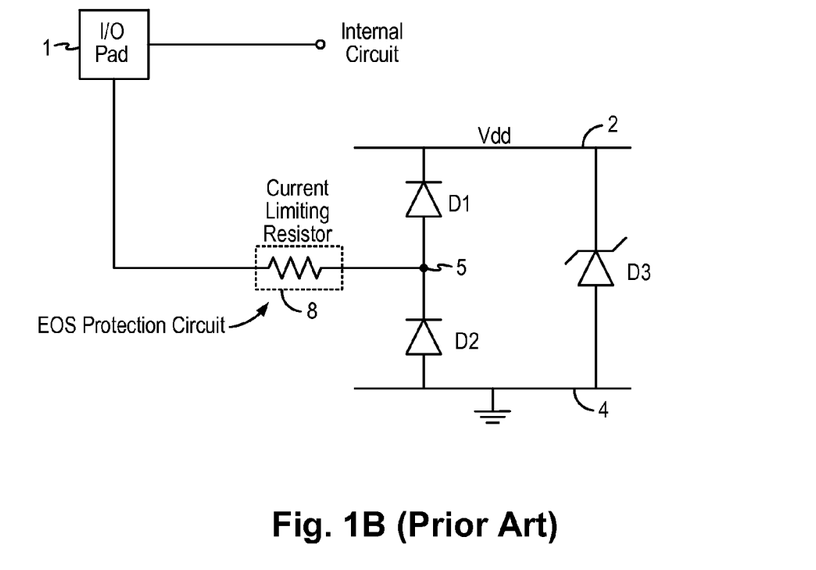
FIG. 1B illustrates EOS/ESD protection circuits for an input-output (I/O) pin of an semiconductor integrated circuit in some examples.

FIG. 1B illustrates EOS/ESD protection circuits for an input-output (I/O) pin of an semiconductor integrated circuit in some examples. In the example shown in FIG. 2, a current limiting resistor 8 is used as the EOS protection circuit and is connected in series with I/O pad 1. Accordingly, the EOS protection circuit can be used with high current I/O pins. However, current limiting resistors are large in size and consume large silicon real estate.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a fuse structure in a semiconductor device uses a metal fuse element connected to a stacked via fuse link connected to a thin film resistive element. The thin film resistive element functions as a heating element. The stacked via fuse link is positioned in closed proximity to the thin film resistive element to facilitate the heat transfer from the heating element to the metal fuse element, thereby aiding in the melting of the metal in the fuse link and the breaking of the fuse circuit. As thus configured, the fuse structure of the present invention can be used as an effective EOS protection circuit for an input-output pad of a semiconductor integrated circuit. The fuse structure can be incorporated at an I/O pad of a high voltage pin or a low voltage pin and can be connected to a high voltage ESD protection circuit or a low voltage ESD protection circuit. In some applications, the EOS protection circuit incorporating the fuse structure of the present invention can be advantageous applied to low current I/O pins of a semiconductor integrated circuit. The EOS protection circuit incorporating the fuse structure is particularly useful in preventing overheating or fire in a DC-DC converter integrated circuit due to an electrical overstress event caused by pin-to-pin shorts between the high voltage power supply pin and a low voltage pin.

In alternate embodiments of the present invention, an integrated EOS/ESD protection circuit includes a current limiting resistor integrated with an ESD protection circuit. In this manner, EOS protection for a high current I/O pin is made possible without consuming large silicon real estate. In some embodiments, the integrated EOS/ESD protection circuit of the present invention is configured with a high voltage ESD circuit and can be advantageously applied to provide EOS and ESD protection for a high current-low voltage I/O or power supply pin.

In other embodiments, an integrated EOS/ESD protection circuit is configured with a stacked via fuse structure connected in series with the ESD protection circuit and a current limiting resistor integrated with the ESD protection circuit and connected in series with internal circuitry. Effective EOS and ESD protection can be realized without false triggering of the fuse structure.

In the present description, a semiconductor device or an integrated circuit is described as having signal pins and power supply pins. A signal pin refers to an input-output (I/O) pin that receives or provides signals or bias levels. A power supply pin refers to a pin that receives the power supply voltage of the integrated circuit. For simplicity, in the present description, the term "I/O pin" will be used to refer to both a signal pin as well as a power supply pin of an integrated circuit. The EOS and EOS/ESD protection circuits of the present invention can be applied to an I/O pin, which can be either a signal pin or a power supply pin, of an integrated circuit for providing protection against EOS and ESD events. The I/O pins are connected to respective metal pads formed on the semiconductor substrate of the semiconductor device. The I/O pad connects to internal circuitry of the integrated circuit. In the present description, the term "I/O pad" will be used to refer to the metal pad connected to a signal pin or a power supply pin.

Figure 2:
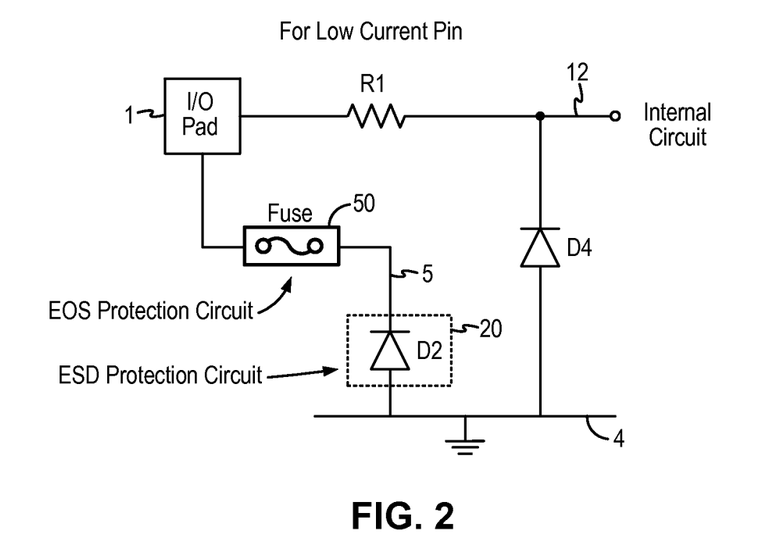
FIG. 2 is a circuit diagram illustrating an EOS protection circuit incorporating a fuse structure in embodiments of the present invention.

FIG. 2 is a circuit diagram illustrating an EOS protection circuit incorporating a fuse structure in embodiments of the present invention. Referring to FIG. 2, an I/O pad 1 is provided with protections circuits against EOS and ESD events. In particular, an EOS protection circuit in the form of a fuse 50 is connected in series to the I/O pad 1 and further in series with an ESD protection circuit 20. In the present illustration, the ESD protection circuit 20 is implemented as a pn junction diode D2. Furthermore, in the present illustration, the ESD protection circuit 20 provides only low-side protection, that is, for ESD zap to ground node. In other embodiments, the ESD protection circuit 20 may be provided with high-side and low-side protection, that is for ESD zap to ground and to the positive power supply. FIG. 2 is illustrative only and is not intended to be limiting.

In the example shown in FIG. 2, the I/O pad 1 has separate signal paths for connecting to the EOS/ESD protection circuits and to the internal circuit. For the signal path to the internal circuit, the I/O pad is connected in series with a current limiting resistor R1. The internal circuit node 12 may further be protected by a voltage clamp implemented by a diode D4 connected in reverse bias between internal circuit node 12 and the ground node 4.

The EOS protection circuit using the fuse 50 can be advantageous applied for low current device pins of an semiconductor integrated circuit. In embodiments of the present invention, the fuse 50 is implemented using the fuse structure of the present invention including metal and polysilicon fuse element connecting to stacked vias as the fuse link. The fuse structure of the present invention realizes effective EOS protection by breaking open in respond to an EOS event to prevent the integrated circuit from overheating. Meanwhile, in the absence of an EOS event, the fuse structure of the present invention is capable of sustaining ESD current in an ESD event to allow the ESD protection circuit to bypass ESD current. In this manner, the fuse structure does not prevent the normal functioning of the ESD protection circuit to protect against ESD events.

Figure 3:
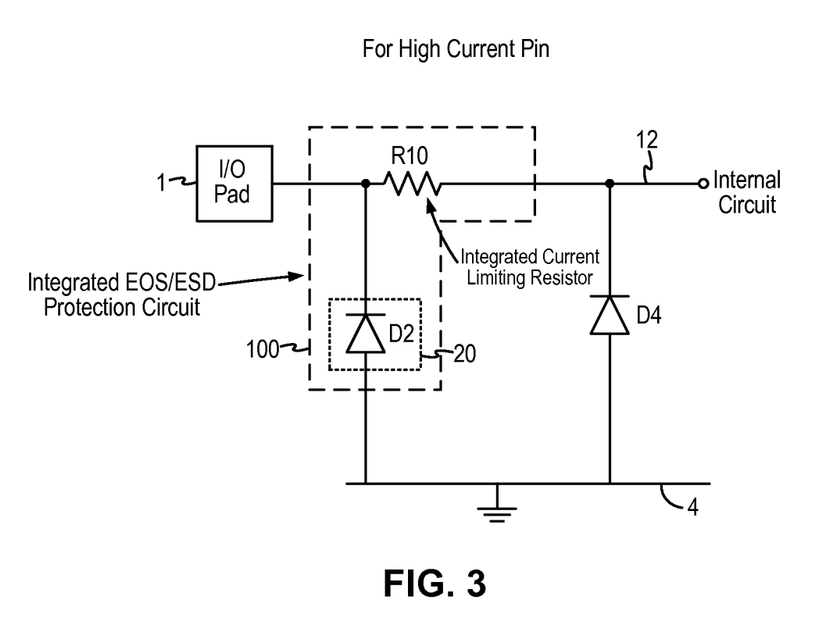
FIG. 3 is a circuit diagram illustrating an integrated EOS/ESD protection circuit incorporating an integrated current limiting resistor in embodiments of the present invention.

FIG. 3 is a circuit diagram illustrating an integrated EOS/ESD protection circuit incorporating an integrated current limiting resistor in embodiments of the present invention. Referring to FIG. 3, an I/O pad 1 is provided with protections circuits against EOS and ESD events. In particular, an integrated EOS/ESD protection circuit 100 includes an ESD protection circuit 20 between the I/O pad 1 and the ground node 4. In the present illustration, the ESD protection circuit 20 provides only low-side protection, that is, for ESD zap to ground node. In other embodiments, the ESD protection circuit 20 may be provided with high-side and low-side protection, that is for ESD zap to ground and to the positive power supply. FIG. 3 is illustrative only and is not intended to be limiting.

The integrated EOS/ESD protection circuit 100 further includes a current limiting resistor R10 in the signal path of the I/O pad 1 to the internal circuit node 12. In embodiments of the present invention, the current limiting resistor R10 is formed as an integrated element of the ESD protection circuit 20. In this manner, a current limiting resistor can be realized without consuming large silicon real estate.

The integrated EOS/ESD protection circuit 100 including the integrated current limiting resistor R10 can be advantageous applied for high current device pins of an semiconductor integrated circuit. Furthermore, the integrated EOS/ESD protection circuit 100 including the integrated current limiting resistor R10 can be advantageous applied in a DC-DC converter integrated circuit to provide protection for the low voltage power supply pad. In the event of a pin-to-pin short between a high voltage power supply pad and a low voltage power supply pad, the low voltage power supply pad is the pad that experiences the severe overheating. In some embodiments, an integrated EOS/ESD protection circuit 100 coupled to a low voltage power supply pin is configured with a high voltage ESD protection circuit, as shown in FIG. 4.

Figure 4:
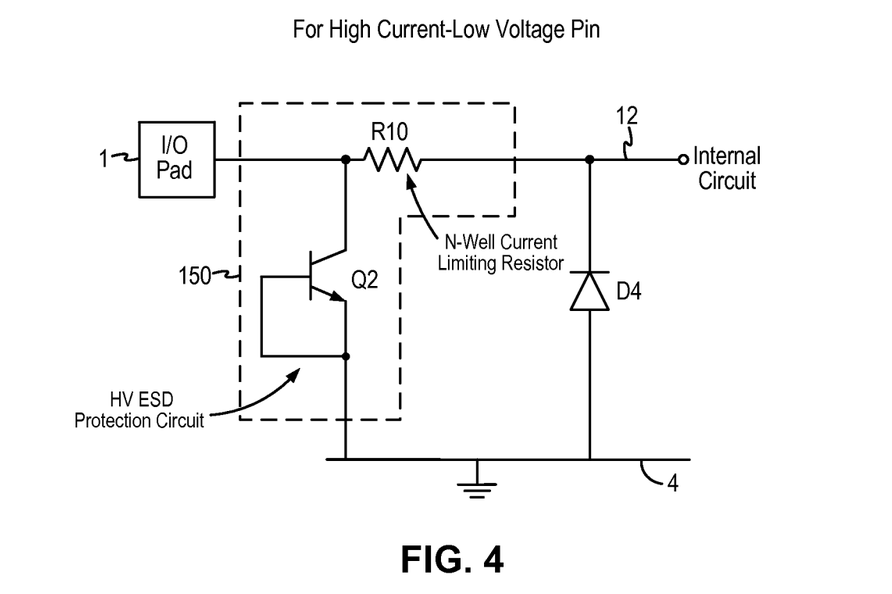
FIG. 4 is a circuit diagram illustrating an integrated EOS/ESD protection circuit incorporating an integrated current limiting resistor in alternate embodiments of the present invention.

FIG. 4 is a circuit diagram illustrating an integrated EOS/ESD protection circuit incorporating an integrated current limiting resistor in alternate embodiments of the present invention. Referring to FIG. 4, an integrated EOS/ESD protection circuit 150 for a high current-low voltage pin, such as a low voltage power supply pin, includes a high voltage ESD protection circuit and an integrated current limiting resistor R10. In the present embodiment, the high voltage ESD protection circuit is configured using an NPN bipolar transistor Q2 and the integrated current limiting resistor R10 is an N-well resistor formed in the N-well of the NPN bipolar transistor Q2. In this manner, the current limiting resistor R10 is formed integrated with the high voltage ESD protection circuit and significant space saving can be realized. In other embodiments, the high voltage ESD protection circuit can be implemented using other high voltage ESD protection structures, such as a silicon controlled rectifier (SCR).

Figure 5:
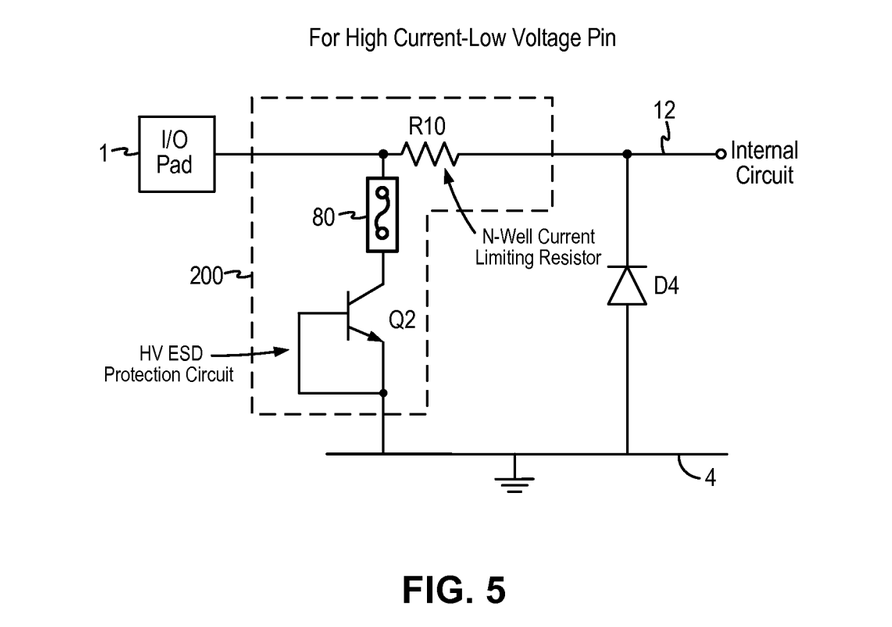
FIG. 5 is a circuit diagram illustrating an integrated EOS/ESD protection circuit incorporating an integrated current limiting resistor and a fuse structure in alternate embodiments of the present invention.

In embodiments of the present invention, an integrated EOS/ESD protection circuit 100 is configured with a high voltage ESD protection circuit and a fuse structure for EOS protection, as shown in FIG. 5. FIG. 5 is a circuit diagram illustrating an integrated EOS/ESD protection circuit incorporating an integrated current limiting resistor and a fuse structure in alternate embodiments of the present invention. Referring to FIG. 5, an integrated EOS/ESD protection circuit 200 for a high current-low voltage pin, such as a low voltage power supply pin, includes a high voltage ESD protection circuit, an integrated current limiting resistor R10, and a fuse structure 80. In the present embodiment, the high voltage ESD protection circuit is configured using an NPN bipolar transistor Q2 and the integrated current limiting resistor R10 is an N-well resistor formed in the N-well of the NPN bipolar transistor Q2. The fuse structure 80 can be formed integrated to the ESD protection circuit and using stacked vias as the fuse link. In this manner, an effective EOS/ESD protection circuit is realized without consuming significant silicon real estate. In other embodiments, the high voltage ESD protection circuit can be implemented using other high voltage ESD protection structures, such as a silicon controlled rectifier (SCR).

Figure 6:
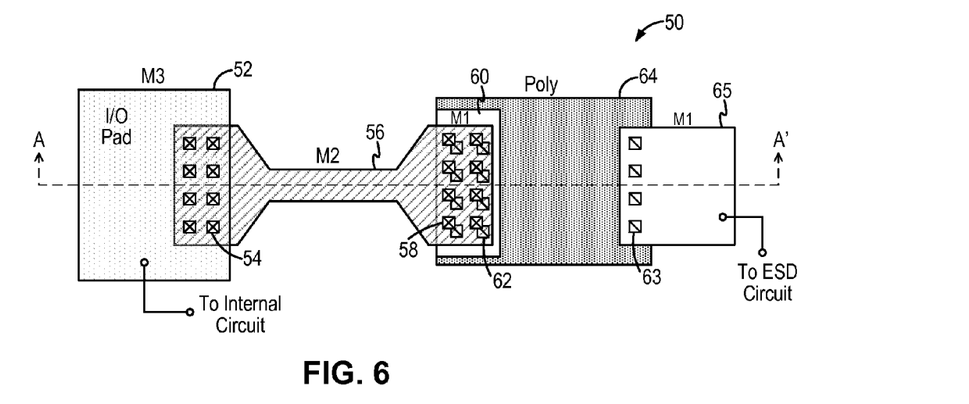
FIG. 6 is a top view of a fuse structure in a semiconductor device in embodiments of the present invention.
Figure 7:
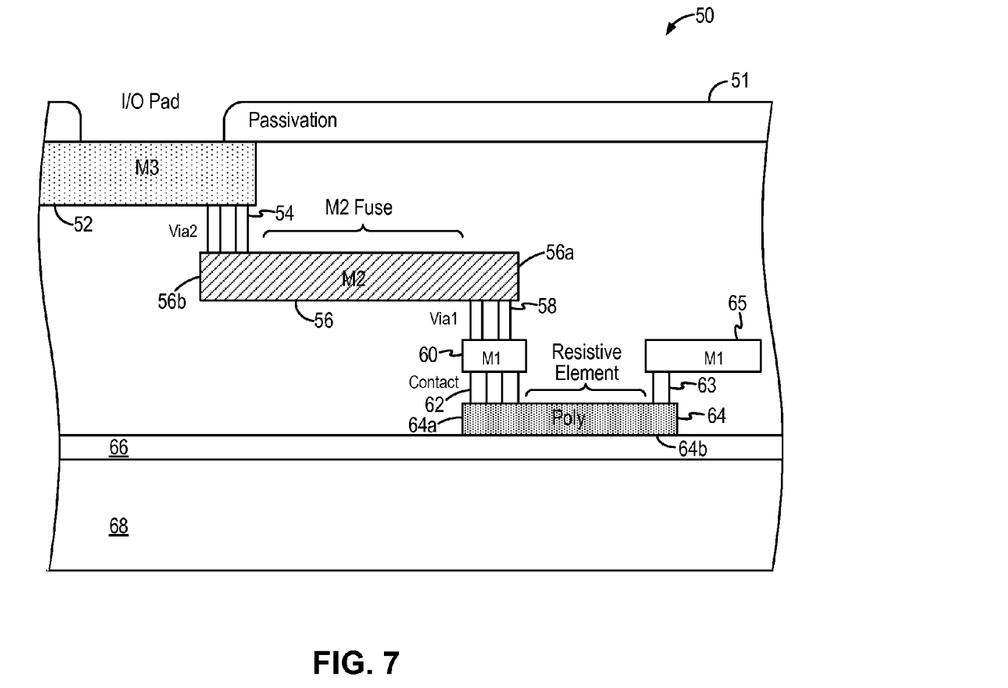
FIG. 7 is a cross-sectional view of the fuse structure of FIG. 6 along the line A-A' in embodiments of the present invention.

FIG. 6 is a top view of a fuse structure in a semiconductor device in embodiments of the present invention. FIG. 7 is a cross-sectional view of the fuse structure of FIG. 6 along the line A-A' in embodiments of the present invention. Referring to both FIGS. 6 and 7, a fuse structure 50 is formed on a semiconductor body 68 of the semiconductor device and insulated from the semiconductor body or other active devices formed thereon by a dielectric layer 66. In some embodiments, the semiconductor body 68 may be a semiconductor substrate, such as a silicon substrate, and the dielectric layer 66 may be an oxide layer, or an silicon nitride layer, or other dielectric layer. The fuse structure 50 is formed near an I/O pad of the semiconductor device. The fuse structure 50 may be formed in an area of the semiconductor body 68 with or without active devices or active circuits. Active devices that may be formed in the semiconductor body 68 are not shown in FIG. 7 for simplicity.

Semiconductor devices are fabricated with fabrication processes that include N metal layers, N typically greater than 1. Each metal layer is connected to an adjacent metal layer through vias. The bottommost metal layer, referred to as the first metal layer or metal 1 or M1, connects to doped regions (or active areas) of the semiconductor body and to the polysilicon layer through contacts. Each metal layer is electrically insulated from an adjacent metal layer by an inter-layer dielectric. The metal 1 layer is electrically insulated from the semiconductor body and the polysilicon layer also by an inter-layer dielectric layer, typically a BPSG layer. In the cross-section shown in FIG. 7, only the conductive layers of the semiconductor device and the interconnection between the conductive layers are shown. The inter-layer dielectric layers are not specifically illustrated but it is understood that each metal layer is insulated from the adjacent layers by an inter-layer dielectric layer.

Semiconductor devices are fabricated using the topmost metal layer, the Nth metal layer as the I/O pads of the semiconductor device. A passivation layer, formed of a dielectric layer such as silicon oxide or silicon nitride, is formed on the entire top surface of the semiconductor device to protect the active circuitry. Openings in the passivation layer expose metal pads formed in the Nth metal layer as the I/O pads.

In embodiments of the present invention, the fuse structure 50 is formed using the (N-1)th metal layer as a metal fuse element. In the present illustration, the fabrication process of the semiconductor device has three metal layers. The I/O pad is formed using the third metal layer (metal 3 or M3). The metal fuse element is formed in the second metal layer (metal 2 or M2) and is connected to the stacked via fuse link. The stacked via fuse link is formed using via1 being the vias between the first metal layer (metal 1 or M1), a metal pad formed using metal 1 layer, and contacts between the first metal layer and the underlying thin film resistive element. In other embodiments, the fuse link may be formed using vias between the first and the N-1 metal layers and metal pads from the first and the N-2 metal layers of a fabrication process involving N metal layers. The vias and the metal pads being stacked in the vertical direction but do not have to be vertically aligned.

The fuse structure 50 is constructed as follows. The fuse structure 50 includes a thin film resistive element as a heating element. The thin film resistive element can be formed using any high resistance thin film layer in the semiconductor fabrication process. Moreover, the thin film resistive element should be formed using a thin film that has a melting point greater than the melting points of the materials used to form the fuse link. In embodiments of the present invention, the thin film resistive element is formed using polysilicon. A polysilicon layer is patterned to form a polysilicon resistive element 64 on the dielectric layer 66. The polysilicon resistive element 64 functions as a resistive heating element for the fuse structure 50. In particular, the near end (64a) of the polysilicon resistive element 64 will develop a large voltage during an EOS event, resulting in heat that will aid in breaking of the fuse circuit, as will be described in more detail below. The polysilicon resistive element 64 may be connected to other circuitry, such as the ESD protection circuit, through contacts 63 formed at a far end (64b) of the polysilicon resistive element 64 and connecting to a metal 1 layer 65.

The stacked via fuse link is formed at the near end (64a) of the polysilicon resistive element 64. More specifically, contacts 62 are formed on the near end (64a) of the polysilicon resistive element 64. The contacts 62 connects to a metal pad 60 formed using the metal 1 layer. Vias 58 are formed on the metal pad 60 and connects to a metal fuse element 56 formed using the second metal layer or M2. The vias 58 are referred to as via 1 being the via connection between the first metal layer and the second metal layer. As thus configured, a stacked via fuse link is formed including vias 58, metal pad 60, and contacts 62 that are stacked on top of each other.

In particular, the metal pad 60 formed in the M1 layer has a dimension sufficient to cover and overlap the contacts 62 and further to cover and overlap the vias 58. The vias 58 are formed stacked on contacts 62. That is, the vias 58 are formed on top of the contacts 62 in the vertical dimension. However, it is not necessary for the vias 58 to be vertically aligned with the contacts 62. It is only necessary that vias 58 are formed above the contacts 62 to form a vertically stacked structure.

The metal fuse element 56 is patterned as an elongated piece of metal 2 layer. The metal fuse element 56 connects to the stacked via fuse link at the near end (56a) and connects to the I/O pad through vias 54 at the far end (56b). Vias 54 are referred to as via 2 as being the via connection between the second metal layer and the third metal layer. The I/O pad is formed in the metal 3 layer and an opening formed in a passivation layer 51 exposes the metal 3 layer as the I/O pad.

In the fuse structure 50, the fuse link is formed using at least one material that have melting points lower than the melting point of the thin film resistive element. In this manner, when the thin film resistive element heats up due to an EOS event, the heat generated will melt the material in the fuse link, breaking the fuse. In embodiments of the present invention, the fuse structure 50 is formed using contacts, vias 1 and vias 2 that are filled with tungsten (W) which has a melting point of greater than 1000° C. The metal 1 and 2 layers are formed using aluminum (Al) which has a melting point of around 550° C. The polysilicon layer used for the thin film resistive element has a melting point of much greater than 1000° C. In embodiments of the present invention, the fuse link includes a metal pad formed using the metal 1 layer with a melting point much lower than the melting point of the polysilicon resistive element. Furthermore, the vias of the fuse link is formed using tungsten which has a melting point much greater than the metal pad so that the vias can conduct heat to the metal pad during an EOS event to cause the metal pad to melt to break the fuse link.

In the embodiment shown in FIG. 6, a single fuse structure 50 is shown. In other embodiments, the fuse structure 50 may be duplicated to form multiple parallel fuse paths, each fuse path including the metal fuse element, the stacked via fuse link and the thin film resistive element.

The operation of the fuse structure 50 is as follows. During an EOS event, current comes in through the I/O pad 52 and flow through the metal fuse element 56, through the stacked via fuse link—via 1, metal 1, contacts—to the polysilicon resistive element 64. The metal fuse element 56 does not limit the current and therefore, there is very little voltage drop across the metal fuse element 56. However, because of the high resistance of the polysilicon layer, the polysilicon resistive element 64 will limit the current and a voltage will build up across the polysilicon resistive element. As a result of the current flow from the EOS event, a high voltage develops at the near end (64a) of the polysilicon resistive element 64 and the near end of the polysilicon resistive element 64 heats up, thereby heating up the stacked via fuse link. In this manner, the polysilicon resistive element 64 functions as a heating element. The contacts 62, the metal pad 60 and the vias 58 heat up as a result of the heating effect of the polysilicon resistive element 64. Because the metal pad 60 has the lowest melting point, when the metal pad 60 is heated to a sufficient temperature, the metal will melt and the fuse link will break. Furthermore, the metal fuse element 56 functions as a second fuse point for the fuse structure 50 after metal pad 60. The stack via fuse link 58 transfers heat from the polysilicon resistive element 64 to the metal fuse element 56 to cause metal fuse element 56 to melt, thereby further breaking the fuse link.

In embodiments of the present invention, when the fuse structure 50 is connected in series with the ESD protection circuit, the fuse path should have lower resistance than the ESD circuit so that during an ESD event, the current will go to the ESD protection circuit. Accordingly, the width of the thin film resistive element can be adjusted to adjust the resistance of the fuse structure. For example, the width of the polysilicon resistive element 64 can be widened to reduce the resistance of the fuse structure. Alternately, the thickness of the metal layer can be adjusted to adjust the resistance of the fuse structure.

The fuse structure described above is useful for providing EOS protection to low current I/O pins, including signal pins and power supply pins. In some cases, the fuse structure of the present invention may not be suitable for high current I/O pins that may cause the fuse to break due to normal high current operating conditions. According to other aspect of the present invention, an EOS protection circuit for high current I/O pins is provided.

Figure 8:
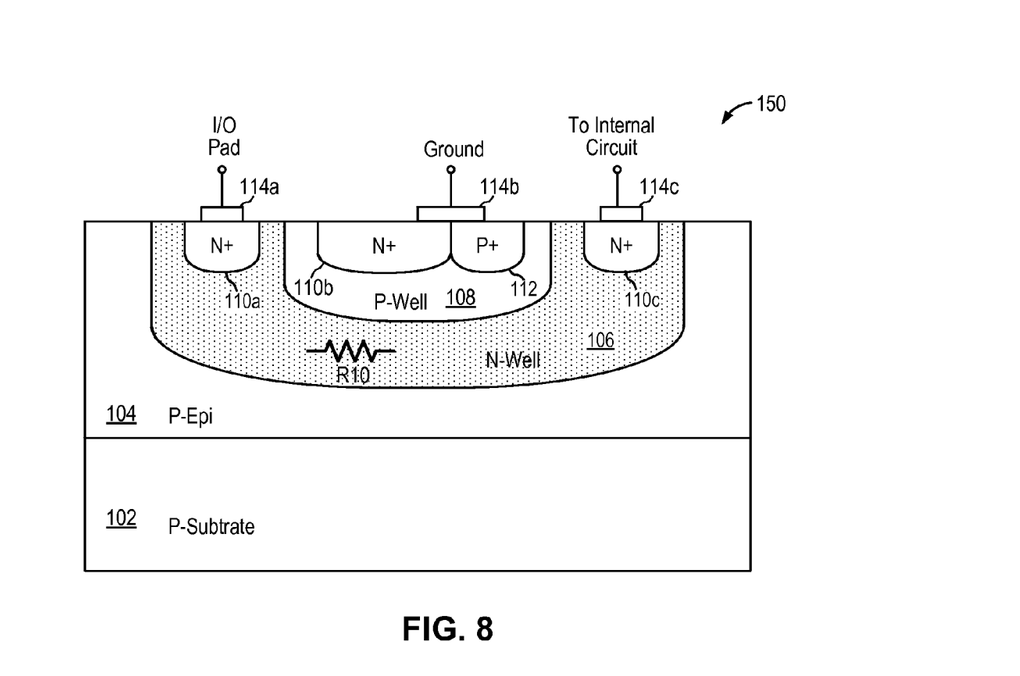
FIG. 8 is a cross-sectional view of an integrated EOS/ESD protection circuit incorporating an integrated current limiting resistor in a semiconductor device in embodiments of the present invention.

FIG. 8 is a cross-sectional view of an integrated EOS/ESD protection circuit incorporating an integrated current limiting resistor in a semiconductor device in embodiments of the present invention. In embodiments of the present invention, an integrated EOS/ESD protection circuit 150 ("protection circuit 150") includes a high voltage ESD protection circuit formed using an NPN bipolar transistor and an EOS protection circuit formed using a current limiting resistor formed in the N-well of the NPN bipolar transistor. In particular, the cross-section shown in FIG. 8 illustrates one method to implement the integrated EOS/ESD protection circuit 150 in FIG. 4.

Although N-well resistor has been used as a current limiting resistor, such N-well resistor is formed as a stand-alone structure, thereby consuming a lot of silicon real estate. In embodiments of the present invention, the N-well current limiting resistor is formed as an integrated resistor into the high voltage ESD protection circuit. In this manner, current limiting EOS protection can be provided without consuming large silicon area.

Referring to FIG. 8, the protection circuit 150 is formed in a semiconductor body. In the present embodiment, the protection circuit 150 is formed in a P-type epitaxial layer 104 formed on a semiconductor substrate, such as a P-type substrate 102. The NPN bipolar transistor of the protection circuit 150 includes a collector formed in an N-well 106, a base formed in a P-well 108 formed in the N-well 106, and an emitter formed in a heavily doped N+ region 110b formed in the P-well 108. A P+ region 112 is formed in the P-well 108 for providing ohmic contact to the P-well. The P-well 108 and the N+ emitter 110b are electrically connected to the ground node, such as through a metal layer 114b. Meanwhile, an N+ region 110a is formed in the N-well 106 to connect to the I/O pad 1 to be protected, such as through a metal layer 114a.

In embodiments of the present invention, a current limiting resistor is formed in the N-well 106 and is connected in series between the I/O pad to be protected and the internal circuit. More specifically, the N-well current limiting resistor (R10) is formed by providing the N+ region 110a that connects to the I/O pad at one end of the N-well 106 and providing an N+ region 110c that connects to the internal circuit at the other end of the N-well 106. Thus, the entire body of the N-well 106 becomes the current limiting resistor R10. The N+ region 110C may be connected to the internal circuit through a metal layer 114c.

In operation, during normal circuit operation, the N-well current limiting resistor will carry very little current and behaves as nearly a short circuit between the I/O pad node (114a) and the internal circuit node (114c). During an EOS event, a large voltage develops at the I/O pad and a large current flows through the I/O pad at the N+ region 110a, through the N-well 106, towards the N+ region 110c to the internal circuit. The N-well 106 will limit the current to a certain level to protect the internal circuit. Thus, during an EOS event, although a high voltage may be present at the I/O pad (114a), the internal circuit node 114c is at a low voltage because the current is limited by the N-well 116.

Meanwhile, during an ESD event when an ESD zap is received at the I/O pad 114a, the NPN bipolar transistor formed by N-well 106, P-well 108 and N+ region 110b will break down to bypass the ESD current. In embodiments of the present invention, the protection circuit 150 is implemented with a high voltage ESD circuit to sustain a high voltage, such as 24V during an ESD event. The I/O pin and the internal circuit to be protected may have a low voltage rating, such as 5V. Thus, during an ESD event, the ESD circuit may rise up to 24V at the emitter terminal (N-well 106). However, the internal circuit is maintained at 5V due to the current limiting resistor of N-well 106.

Figure 9:
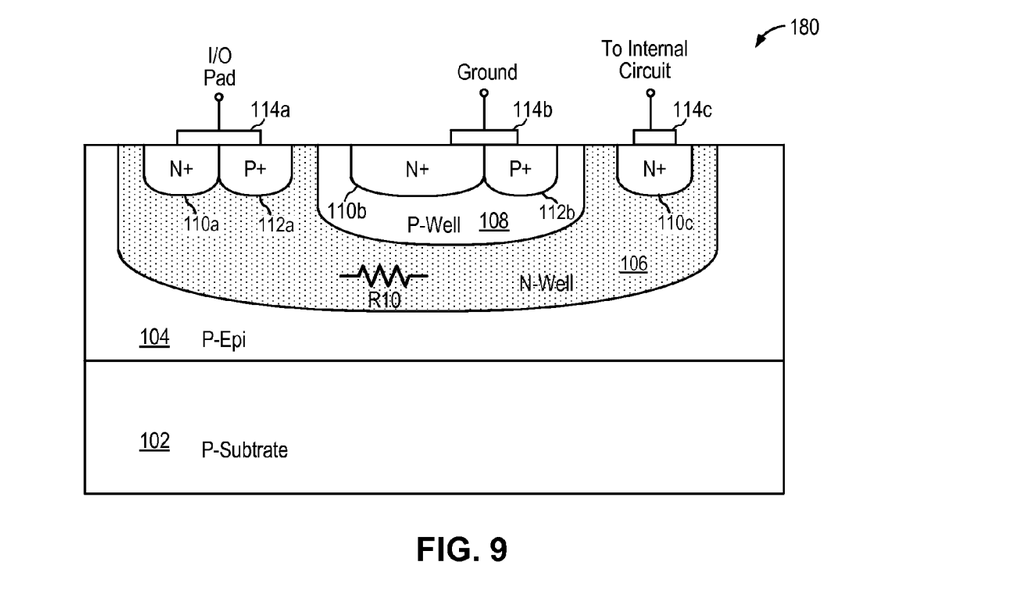
FIG. 9 is a cross-sectional view of an integrated EOS/ESD protection circuit incorporating an integrated current limiting resistor in a semiconductor device in alternate embodiments of the present invention.

FIG. 9 is a cross-sectional view of an integrated EOS/ESD protection circuit incorporating an integrated current limiting resistor in a semiconductor device in alternate embodiments of the present invention. In embodiments of the present invention, an integrated EOS/ESD protection circuit 180 ("protection circuit 180") includes a high voltage ESD protection circuit formed using a silicon-controlled rectifier (SCR) and an EOS protection circuit formed using a current limiting resistor formed in the N-well of the SCR.

Referring to FIG. 9, the protection circuit 180 is formed in a semiconductor body. In the present embodiment, the protection circuit 180 is formed in a P-type epitaxial layer 104 formed on a semiconductor substrate, such as a P-type substrate 102. The SCR of the protection circuit 180 includes an anode formed in a P+ region 112a and an N+ region 110a both formed in the N-well 106, a gate formed in the P-well 108, and a cathode formed in an N+ region 110b formed in the P-well. A P+ region 112b is formed in the P-well 108 for providing ohmic contact to the P-well. The P-well gate 108 and the N+ cathode 110b are electrically connected to the ground node, such as through a metal layer 114b. Meanwhile, I/O pad 1 to be protected is connected to the N+ region 110a and the P+ region 112a at one end of N-well 106, such as through a metal layer 114a.

In embodiments of the present invention, a current limiting resistor is formed in the N-well 106 and is connected in series between the I/O pad to be protected and the internal circuit. More specifically, the N-well current limiting resistor (R10) is formed by providing the N+ region 110a that connects to the I/O pad at one end of the N-well 106 and providing an N+ region 110c that connects to the internal circuit at the other end of the N-well 106. Thus, the entire body of the N-well 106 becomes the current limiting resistor R10. The N+ region 110C may be connected to the internal circuit through a metal layer 114c.

The operation of the protection circuit 180 is similar to the protection circuit 150 and will not be described in detail. During an EOS event, the N-well current limiting resistor will limit the current so that the internal circuit does not experience a high voltage. During an ESD event, the SCR turns on in the forward conduction mode to bypass the ESD current. Effective overcurrent and overvoltage protection is realized.

Figure 10:
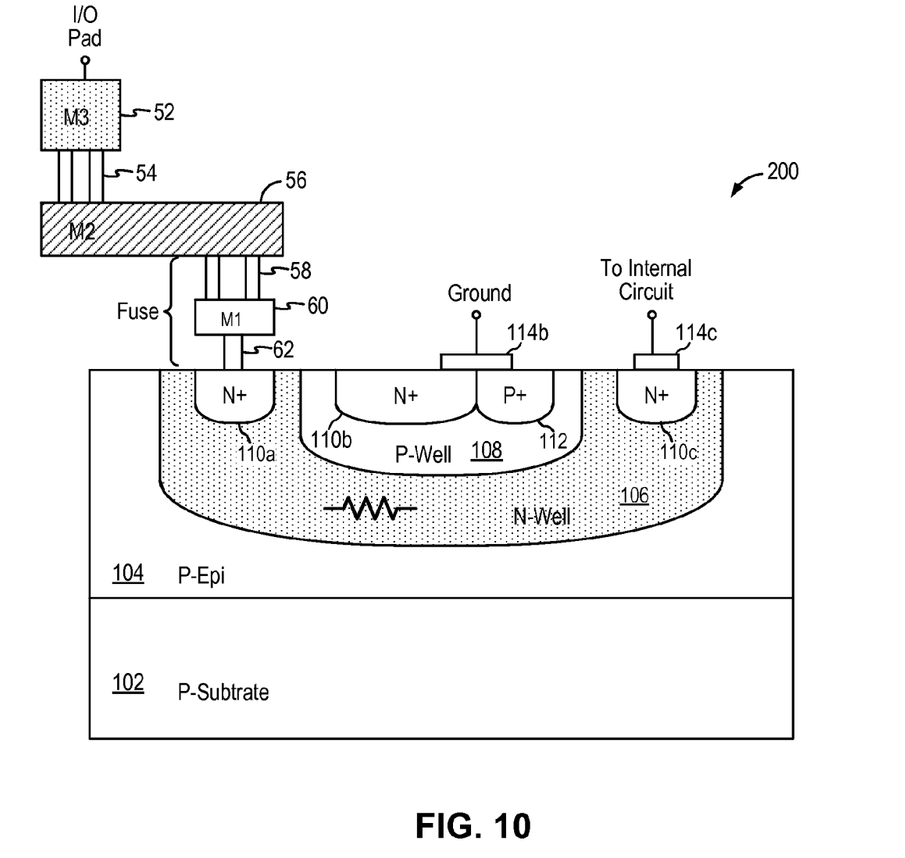
FIG. 10 is a cross-sectional view of an integrated EOS/ESD protection circuit incorporating a stacked via fuse structure in a semiconductor device in embodiments of the present invention.

In embodiments of the present invention, the integrated EOS/ESD protection circuits of FIGS. 8 and 9 may be provided with a stacked via fuse structure to provide additional EOS protection. FIG. 10 is a cross-sectional view of an integrated EOS/ESD protection circuit incorporating a stacked via fuse structure in a semiconductor device in embodiments of the present invention. In particular, the cross-section shown in FIG. 10 illustrates one method to implement the integrated EOS/ESD protection circuit 200 in FIG. 5.

Referring to FIG. 10, an integrated EOS/ESD protection circuit 200 is constructed in the same manner as the EOS/ESD protection circuit 150 in FIG. 8 and will not be further described. A stacked via fuse structure is formed in series with the integrated EOS/ESD protection circuit. A metal pad 60 formed in the metal 1 layer is electrically connected to the N+ region 110a through a contact 62. Vias 58 are formed on the metal pad 60 and stacked on the contact 62. A metal fuse element 56 formed in the metal 2 layer has one end connecting to the vias 58 and another end connected to vias 54. Vias 54 are connected to a metal pad 52 formed in the metal 3 layer. For example, the metal pad 52 may be the I/O pad of the semiconductor device.

In the fuse structure of FIG. 10, the N-well 106 serves as the thin film resistive element and provides the heating necessary to melt the metal pad 60 to break the fuse link. During an EOS event, large voltage and current flowing in from the I/O pad (metal pad 52) will cause a high voltage to develop at the N+ region 110a. Heating at the N+ region 110a, the contacts 62 and the vias 58 will cause metal pad 60 to melt, breaking the fuse link.

Figure 11:
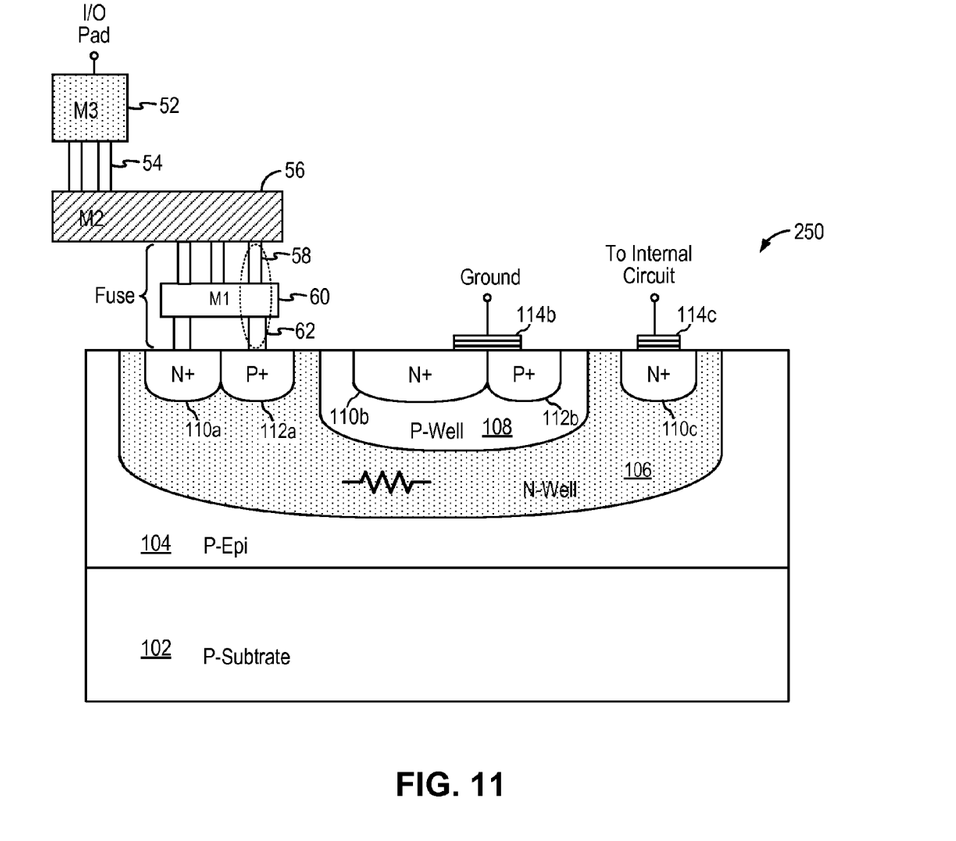
FIG. 11 is a cross-sectional view of an integrated EOS/ESD protection circuit incorporating a stacked via fuse structure in a semiconductor device in alternate embodiments of the present invention.

FIG. 11 is a cross-sectional view of an integrated EOS/ESD protection circuit incorporating a stacked via fuse structure in a semiconductor device in alternate embodiments of the present invention. Referring to FIG. 11, an integrated EOS/ESD protection circuit 250 is constructed in the same manner as the EOS/ESD protection circuit 180 in FIG. 9 and will not be further described. A stacked via fuse structure is formed in series with the integrated EOS/ESD protection circuit. A metal pad 60 formed in the metal 1 layer is electrically connected to the N+ region 110a and P+ region 112a through contacts 62. Vias 58 are formed on the metal pad 60 and stacked on the contact 62. A metal fuse element 56 formed in the metal 2 layer has one end connecting to the vias 58 and another end connected to vias 54. Vias 54 are connected to a metal pad 52 formed in the metal 3 layer. For example, the metal pad 52 may be the I/O pad of the semiconductor device.

In the fuse structure of FIG. 11, the N-well 106 serves as the thin film resistive element and provides the heating necessary to melt the metal pad 60 to break the fuse link. During an EOS event, large voltage and current flowing in from the I/O pad (metal pad 52) will cause a high voltage to develop at the N+ region 110a and P+ region 112a. Heating at the N+ region 110a, the contacts 62 and the vias 58 will cause metal pad 60 to melt, breaking the fuse link.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A fuse structure formed in a semiconductor device and connected in series with an input-output pad of the semiconductor device, the semiconductor device being fabricated using a fabrication process including N metal layers from a bottommost metal layer being the first metal layer to a topmost metal layer being the Nth metal layer, the fuse structure comprising:
    a thin film resistive element formed on and insulated from a semiconductor body, the thin film resistive element having a first end and a second end, the second end being electrically connected to a circuit of the semiconductor device;
    one or more metal pads formed using one or more metal layers from the first metal layer to the (N-2)th metal layer, a first metal pad formed in the first metal layer being connected through contacts to the first end of the thin film resistive element, each metal pad being connected to an adjacent metal pad using vias, the vias and the one or more metal pads being stacked in a vertical direction above the contacts and the first end of the thin film resistive element, the one or more metal pads being formed of a material having a melting point much lower than the melting point of the thin film resistive element;
    a metal fuse element having a first end connected through vias to the input-output pad and a second end connected through vias to the metal pad formed in the (N-2)th metal layer, the input-output pad being formed using the topmost metal layer and the metal fuse element being formed using the (N-1)th metal layer,
    wherein the vias, the one or more metal pads and the contacts form the fuse link of the fuse structure, the fuse structure protects the input-output pad of the semiconductor device from an electrical overstress event by breaking of the fuse link in response to an electrical overstress event.

2. The fuse structure of claim 1, wherein a voltage develops across the thin film resistive element in response to an electrical overstress event, causing the thin film resistive element to heat up, the heat generated by the thin film resistive element causing the vias and the one or more metal pads to also heat up, resulting in at least one metal pad being melted in response to the heat and thereby breaking the fuse link.

3. The fuse structure of claim 2, wherein in response to the heat generated by the thin film resistive element, the metal fuse element also heats up, resulting in melting of the metal fuse element in response to the electrical overstress event.

4. The fuse structure of claim 1, wherein the thin film resistive element comprises a material having a melting point much greater than the metal points of the materials used to form the one or more metal pads of the fuse link.

5. The fuse structure of claim 1, wherein the contacts and the vias are formed of materials having a melting point much greater than the metal points of the materials used to form the one or more metal pads of the fuse link.

6. The fuse structure of claim 1, wherein the thin film resistive element comprises a polysilicon resistive element, the one or more metal pads comprise aluminum metal pads, and the vias comprise tungsten vias.

7. The fuse structure of claim 1, wherein the semiconductor device comprises three metal layers, the input-output pad being formed using the topmost or third metal layer, the metal fuse element being formed using the second metal layer, and the one or more metal pads comprises a metal pad formed in the bottommost or first metal layer.

8. The fuse structure of claim 1, wherein the thin film resistive element, the one or more metal pads and the metal fuse element form a single fuse path, the fuse structure further comprising multiple parallelly connected fuse paths, each fuse path comprising the thin film resistive element, the one or more metal pads and the metal fuse element.

9. The fuse structure of claim 1, wherein the second end of the thin film resistive element is electrically connected to an electrostatic discharge circuit of the semiconductor device.

10. The fuse structure of claim 1, wherein the metal fuse element comprises an elongated piece of the (N-1)th metal layer.

11. The fuse structure of claim 1, wherein the semiconductor body comprises a semiconductor substrate and an insulating layer on top of the semiconductor substrate.

12. A protection circuit formed in a semiconductor device and connected to an input-output pad of the semiconductor device, the protection circuit comprising:
    an electrostatic discharge (ESD) protection circuit formed in a semiconductor body and connected between the input-output pad and a ground node, the ESD protection circuit being configured to bypass current associated with an ESD event to the ground node;
    a current limiting resistor connected in series between the input-output pad and an internal circuit node of the semiconductor device, the current limiting resistor being formed integrated with and being a part of the ESD protection circuit; and
    a fuse structure connected in series between the input-output pad and the ESD protection circuit, the fuse structure comprising a fuse link configured as a metal pad formed stacked in the vertical direction between contacts and vias, the fuse link being connected to a metal fuse element connecting to the input-output pad.

13. A protection circuit formed in a semiconductor device and connected to an input-output pad of the semiconductor device, the protection circuit comprising:
    an electrostatic discharge (ESD) protection circuit formed in a semiconductor body and connected between the input-output pad and a ground node, the ESD protection circuit being configured to bypass current associated with an ESD event to the ground node; and
    a current limiting resistor connected in series between the input-output pad and an internal circuit node of the semiconductor device, the current limiting resistor being formed integrated with and being a part of the ESD protection circuit,
    wherein the ESD protection circuit comprises an NPN bipolar transistor having a collector formed in an N-well, a base formed in a P-well formed in the N-well, and an emitter formed as a first heavily doped N-type region formed in the P-well, the collector being electrically connected to the input-output pad, the base and the emitter being electrically connected together to the ground node; and wherein the current limiting resistor is formed in the N-well, a first end of the N-well being connected to the input-output pad and a second end of the N-well being connected to the internal circuit node, the N-well between the first end and the second end forming the current limiting resistor.

14. The protection circuit of claim 13, wherein the current limiting resistor comprises a second heavily doped N-type region formed at the first end of the N-well and connected to the input-output pad, and a third heavily doped N-type region formed at the second end of the N-well and connected to the internal circuit node, the first end and the second end of the N-well being spaced apart from each other.

15. A protection circuit formed in a semiconductor device and connected to an input-output pad of the semiconductor device, the protection circuit comprising:
    an electrostatic discharge (ESD) protection circuit formed in a semiconductor body and connected between the input-output pad and a ground node, the ESD protection circuit being configured to bypass current associated with an ESD event to the ground node; and
    a current limiting resistor connected in series between the input-output pad and an internal circuit node of the semiconductor device, the current limiting resistor being formed integrated with and being a part of the ESD protection circuit,
    wherein the ESD protection circuit comprises an silicon-controlled rectifier (SCR) having an anode formed in a first heavily doped N-type region and a first heavily doped P-type region formed in an N-well, a gate formed in a P-well formed in the N-well, and a cathode formed as a second heavily doped N-type region formed in the P-well, the anode being electrically connected to the input-output pad, the gate and the cathode being electrically connected together to the ground node; and
    wherein the current limiting resistor is formed in the N-well, a first end of the N-well being connected to the input-output pad and a second end of the N-well being connected to the internal circuit node, the N-well between the first end and the second end forming the current limiting resistor.

16. The protection circuit of claim 13, wherein the current limiting resistor comprises the first heavily doped N-type region formed at the first end of the N-well and connected to the input-output pad, and a third heavily doped N-type region formed at the second end of the N-well and connected to the internal circuit node, the first end and the second end of the N-well being spaced apart from each other.

17. The protection circuit of claim 14, further comprising a fuse structure connected in series between the input-output pad and the ESD protection circuit, the fuse structure comprising a fuse link configured as a metal pad formed stacked in the vertical direction between vias and contacts, the contacts connecting to the second heavily doped N-type region, the fuse link being connected to a metal fuse element connecting to the input-output pad.

18. The protection circuit of claim 15, further comprising a fuse structure connected in series between the input-output pad and the ESD protection circuit, the fuse structure comprising a fuse link configured as a metal pad formed stacked in the vertical direction between vias and contacts, the contacts connecting to the first heavily doped N-type region, the fuse link being connected to a metal fuse element connecting to the input-output pad.

\* \* \* \* \*